United States Patent
Gardner et al.

(12) 
(10) Patent No.: US 6,168,958 B1
(45) Date of Patent: Jan. 2, 2001

(54) SEMICONDUCTOR STRUCTURE HAVING MULTIPLE THICKNESSES OF HIGH-K GATE DIELECTRICS AND PROCESS OF MANUFACTURE THEREFOR

(75) Inventors: Mark I. Gardner, Cedar Creek; H. Jim Fulford; Charles E. May, both of Austin, all of TX (US)

(73) Assignee: Advanced Micro Devices Inc., Sunnyvale, CA (US)

( * ) Notice: Under 35 U.S.C. 154(b), the term of this patent shall be extended for 0 days.

(21) Appl. No.: 09/130,494

(22) Filed: Aug. 7, 1998

(51) Int. Cl.$^7$ ................................................. H01L 29/76
(52) U.S. Cl. ......................... 438/3; 438/216; 438/275; 438/287
(58) Field of Search ........................ 257/295, 324, 257/325, 326, 368, 410; 438/3, 216, 275, 287, 588

(56) References Cited

U.S. PATENT DOCUMENTS

| | | | |
|---|---|---|---|
| 4,329,706 | * | 5/1982 | Crowder et al. ................... 257/756 |
| 4,342,149 | * | 8/1982 | Jacobs et al. ...................... 257/410 |
| 4,380,804 | * | 4/1983 | Lockwood et al. ................. 257/316 |
| 5,292,673 | * | 3/1994 | Shinriki et al. ..................... 438/287 |
| 5,679,599 | | 10/1997 | Mehta . |
| 5,763,310 | | 6/1998 | Gardner . |
| 5,777,370 | | 7/1998 | Omid-Zohoor et al. . |
| 5,786,256 | | 7/1998 | Gardner et al. . |
| 5,985,706 | * | 11/1999 | Gilmer et al. ....................... 438/199 |

* cited by examiner

Primary Examiner—J. Carroll

(57) ABSTRACT

A semiconductor structure having multiple thicknesses of high-k gate dielectrics and a process of manufacture. In one embodiment, semiconductor structure is provided that includes a substrate, and a high permittivity layer is disposed on the substrate, the high permittivity layer having two or more areas with different thicknesses. A plurality of gate electrodes are disposed in the two or more areas on the high permittivity layer. In another embodiment, a process for constructing a semiconductor structure includes depositing a high permittivity layer on the substrate, the high permittivity layer having a first thickness. A first set of one or more gate electrodes are formed on the high permittivity layer having the first thickness. Selected portions of the high permittivity layer are then removed, whereby the high permittivity layer is reduced to a second thickness. Then a second set of gate electrodes are formed on the selected portions of the high permittivity layer having the second thickness.

24 Claims, 3 Drawing Sheets

SEMICONDUCTOR STRUCTURE HAVING MULTIPLE THICKNESSES OF HIGH-K GATE DIELECTRICS AND PROCESS OF MANUFACTURE THEREFOR

FIELD OF THE INVENTION

The present invention is directed generally to semiconductor structures, and more particularly, to a semiconductor structure having multiple thicknesses of high-K gate dielectrics.

BACKGROUND OF THE INVENTION

Over the last few decades, the electronics industry has undergone a revolution by the use of semiconductor technology to fabricate small, highly integrated electronic devices. The most common semiconductor technology presently used is silicon-based. A large variety of semiconductor devices have been manufactured having various applicability and numerous disciplines. One such silicon-based semiconductor device is a metal-oxide-semiconductor (MOS) transistor.

A typical MOS semiconductor device generally includes a gate electrode, which acts as a conductor, to which an input signal is typically applied via a gate terminal. Heavily doped source/drain regions are formed in a semiconductor substrate and are respectively connected to source and drain terminals. A channel region is formed in the semiconductor substrate beneath the gate electrode and separates the source/drain regions. The channel is typically lightly doped with a dopant type opposite that of the source/drain regions. The gate electrode is physically separated from the semiconductor substrate by a gate insulating layer, typically an oxide layer such as $SiO_2$. The insulating layer is provided to prevent current from flowing between the gate electrode and the source/drain regions or channel regions.

In operation, an output voltage is typically developed between the source and drain terminals. When an input voltage is applied to the gate electrode, a transverse electric field is set up in the channel region. By varying the transverse electric field, it is possible to modulate the conductance of the channel region between the source region/drain regions. In this manner an electric field controls the current flow through the channel region. This type of device is commonly referred to as a MOS field-effect-transistors (MOSFET).

Semiconductor devices, like the one described above, are used in large numbers to construct most modern electronic devices. In order to increase the capability of such electronic devices, it is necessary to integrate ever increasing numbers of such devices into a single silicon wafer. As the semiconductor devices are scaled down (i.e., made smaller) and in order to form a larger number of devices on a given surface area, the structure of the devices and fabrication techniques used to make such devices must be altered.

One important step in the manufacture of MOS devices is the formation of the gate insulating layer. The gate insulating layer is typically formed by growing an oxide, typically $SiO_2$, over the surface of the substrate. It is important to carefully control the growth of the gate oxide layer because the thickness and uniformity of the gate oxide layer can significantly impact the overall operation of the device being formed. For example, the drive current in a MOS transistor is inversely proportional to the gate oxide thickness at a given set of terminal voltages. Accordingly, it is normally desired to increase the drive current of the transistor by making the gate oxide as thin as possible, taking into consideration the oxide breakdown and reliability considerations of the process and technology being used.

The above described conventional techniques for forming gate oxide layers impose limitations on the minimum thickness of the gate oxide layer and on the ability to control the uniformity of the gate oxide layer. As the thresholds for minimum thickness and uniformity control are reached, the ability to further scale down the semiconductor devices is hindered.

SUMMARY OF THE INVENTION

Generally, the present invention relates to a semiconductor structure having multiple thicknesses of high-K gate dielectrics. In one embodiment, a semiconductor structure is provided that includes a substrate, and a high permittivity layer is disposed on the substrate which has two or more areas with different thicknesses. A plurality of gate electrodes are disposed in the two or more areas on the high permittivity layer.

In another embodiment, a process is provided for constructing a semiconductor structure. The process includes depositing a high permittivity layer on the substrate, the high permittivity layer having a first thickness. A first set of one or more gate electrodes are formed on the high permittivity layer having the first thickness. Selected portions of the high permittivity layer are then removed, whereby the high permittivity layer is reduced to a second thickness. Then a second set of gate electrodes are formed on the selected portions of the high permittivity layer having the second thickness.

A process for forming a semiconductor structure on a silicon substrate is provided in another embodiment. The process comprises depositing a high permittivity layer on the substrate, the high permittivity layer having a first thickness of about 100–500 Å and a dielectric constant of at least 20. A gate conductive layer is deposited on the high permittivity layer, and selected portions of the gate conductive layer are etched, whereby a first set of one or more gate electrodes are formed on the high permittivity layer having the first thickness. Further, etching selected portions of the high permittivity layer reduces the high permittivity layer to a second thickness. A second set of gate electrodes is then formed on the selected portions of the high permittivity layer having the second thickness.

The above summary of the present invention is not intended to describe each illustrated embodiment or every implementation of the present invention. The figures and the detailed description which follow more particularly exemplify these embodiments.

BRIEF DESCRIPTION OF THE DRAWINGS

The invention may be more completely understood in consideration of the following detailed description of various embodiments of the invention in connection with the accompanying drawing, in which.

Figure 1:
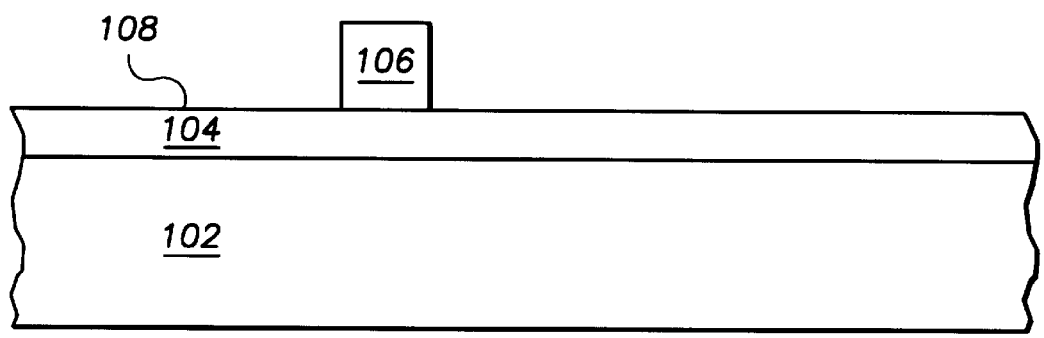
FIG. 1 is a partial cross-sectional view of a semiconductor substrate on which a gate dielectric layer and a gate electrode have been formed.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

The present invention is believed to be applicable to a variety of semiconductor transistor arrangements. The invention has been found to be particularly advantageous in applications where it is desirable to use a high permittivity gate dielectric to form transistors, such as in PMOS, NMOS, CMOS, and BiCMOS devices. While the present invention is not so limited, an appreciation of various aspects of the invention is best gained through a discussion of various application examples of processes used to form such semiconductor devices.

For performance purposes, different sections of an integrated circuit may require different gate insulating layer thicknesses, such as providing a high density formation of transistors for memory. For example, some portions of a circuit, such as fast logic regions may have transistors formed from about 0.03–0.05 microns lower in transistor length as compared to the transistors of 0.1 to 0.2 microns.

FIG. 1 is a partial cross-sectional view of a substrate 102 on which a gate dielectric layer 104 and a gate electrode 106 have been formed. In the example embodiment, the gate dielectric layer is comprised of a high permittivity material which is also referred to herein as "high-K" material. Depositing the high-K material directly on the substrate eliminates steps of other alternative processes where an oxy-nitride stack is formed and then nitride layers are selectively removed.

The high-K layer 104 may be formed from a number of different materials as provided below, wherein the dielectric constant (i.e., permittivity) of the high permittivity gate insulating layer varies depending on the type of material used. The dielectric constant of the high permittivity gate insulating layer is typically greater than that of silicon dioxide (dielectric constant of about 4.2) which is normally used to form conventional gate insulating layers. Such high permittivity materials include, for example, barium strontium titanate (BST) ($Ba_{1-x}Sr_xO_3$) having a dielectric constant between about 20 to 200, tantalum oxide ($Ta_xO_y$) having a dielectric constant ranging from about 20 to 200, lead zinc niobate (PZN) ($PbZn_xNb_{1-x}O_3$) having a dielectric constant of about 7,333 and lead scandium tantalum oxide (PST)($PbSc_xTa_{1-x}O_3$) having a dielectric constant of about 3,000. It will be appreciated that the dielectric constant values given above are approximate only and can vary with the process techniques used to form and measure the permittivity of the materials. A more detailed discussion of the formation of gate insulating layers using relatively high permittivity materials and the types of high permittivity materials which may be used are provided in U.S. patent application Ser. No. 08/920,384, entitled "Semiconductor Device Having High Permittivity Gate Insulating Layer and Method of Manufacturing Thereof," filed Aug. 9, 1997, the contents of which are herein incorporated by reference.

In one particular embodiment, the gate dielectric layer 104 or "high permittivity layer" is formed using a conventional sputter deposition process. The thickness of the high permittivity layer 104 is selected in consideration of the desired characteristics of the insulative layers as well as in consideration of reliability concerns. Example thicknesses range from about 100 to 3000 Å. While these thicknesses are substantially thicker than present $SiO_2$ gate oxide thicknesses, it will be appreciated that as compared to $SiO_2$ thickness for comparable dielectric constants, the thickness of the high permittivity gate insulating layer 104 can be lower than conventional $SiO_2$ gate insulating layers. For example, 16 Å of a tantalum oxide ($Ta_xO_y$) having a dielectric constant of about 25 is equivalent to 4.0 Å of silicon dioxide having a dielectric constant of 4.2.

Following deposition of the high-K layer 104, a gate conductive layer (not shown), for example, polysilicon, is deposited on the surface 108 of the high-K layer. The deposition is accomplished by blanket depositing polysilicon in a chemical vapor deposition (CVD) process and thereafter doping the polysilicon such that the gate conductive layer comprises a highly doped polysilicon film. For purposes of this disclosure, "highly doped polysilicon" is defined as polysilicon having a sheet resistance less than 500 Ohms/sq. Alternatively, the gate conductive layer may comprise titanium nitride, titanium tungsten, or other conductive material compatible with the process sequence. The gate conductive layer is planarized with a chemical-mechanical polish, possibly in combination with photomask steps and dry etch steps to produce one or more gate electrodes, such as gate electrode 106.

The polysilicon is highly selective to the high permittivity layer. Thus, after the etch of the polysilicon to form the gate electrode 106, there is minimal loss in the high-K layer 104.

Figure 2:
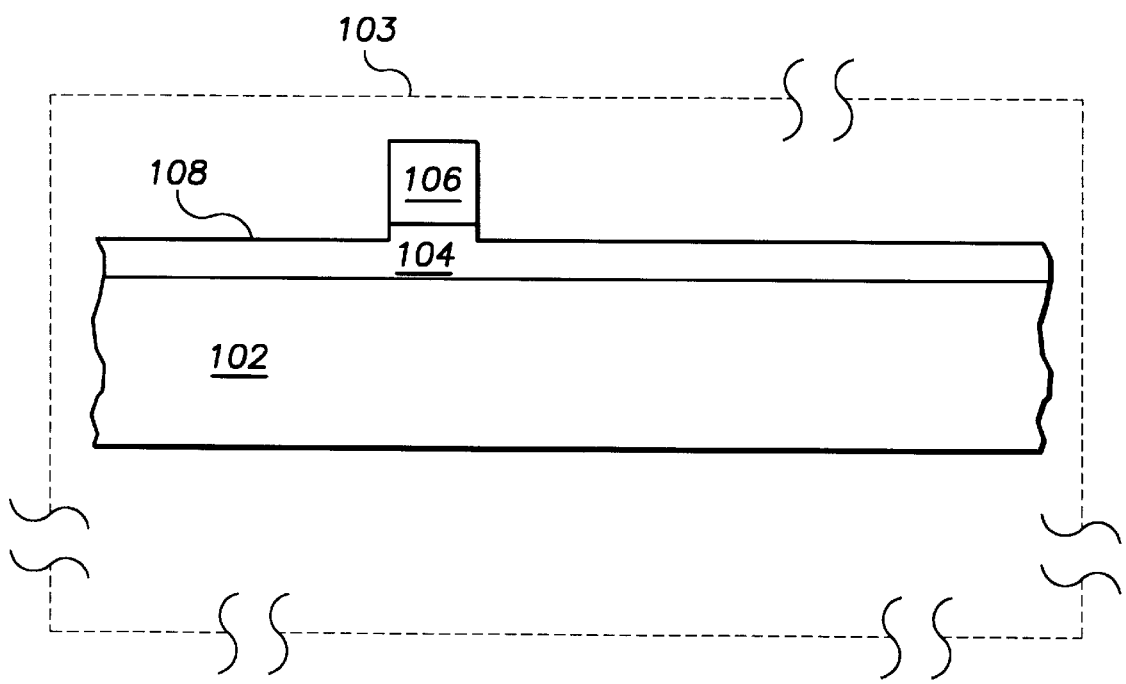
FIG. 2 is a partial cross-sectional view of a semiconductor structure in which the high-K layer is reduced to a selected thickness after having had a gate electrode formed thereon.

FIG. 2 is a partial cross-sectional view of a semiconductor structure in which the high-K layer 104 is reduced to a selected thickness after having had a gate electrode 106 formed thereon. A different plasma chemistry in reaction chamber 103 is used to reduce the thickness of the high-K layer 104 as compared to etching of polysilicon to form gate 106. This may be advantageously performed in situ, that is in the same chamber. The high-K layer is etched with $CHF_3$ and Argon, for example, whereas the polysilicon layer is etched with HBr and $Cl_2$, in accordance with known operating parameters.

Figure 3:
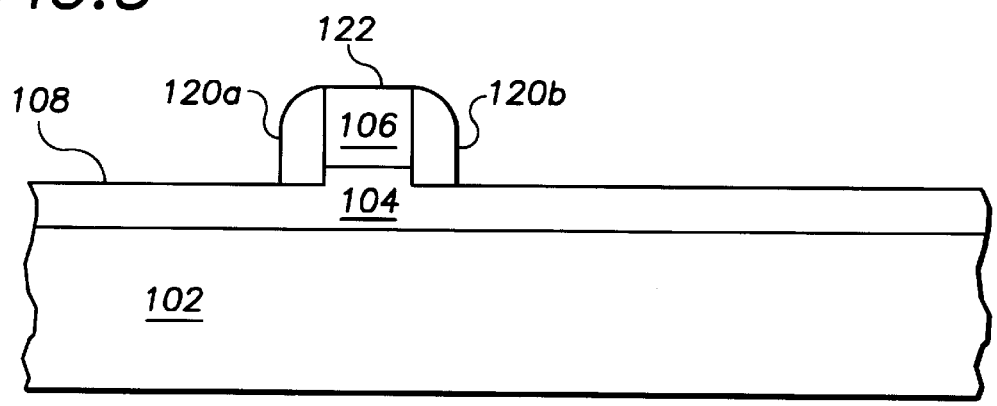
FIG. 3 is a partial cross-sectional view of a semiconductor structure in which spacers and have been formed beside a gate electrode on the reduced thickness high-K layer.

FIG. 3 is a partial cross-sectional view of a semiconductor structure in which spacers 120a and 120b have been formed beside the gate electrode 106 on the reduced thickness high-K layer 104. In a first stage of the process sequence of FIG. 3, spacer material is deposited over the high-K layer 104 and over the gate electrode 106. In an example, the spacer material is comprised of a CVD oxide film. The spacer material is then planarized with the surface 122 of gate electrode 106, masked with a photoresistive material to shield the spacers 120a–b, and thereafter etched. Removal of the spacer material leaves spacers 120a–b, and thereafter the photoresistive material is removed.

It will be appreciated that the material chosen for the spacer deposition could be an oxide, nitride, or oxy-nitride, for example. The spacer deposition at this stage of the processing permits a very small separation between transistors. Such separation is less than that permitted by photolithography. Thus in an example embodiment, the spacers are approximately 100 Å wide.

Figure 4:
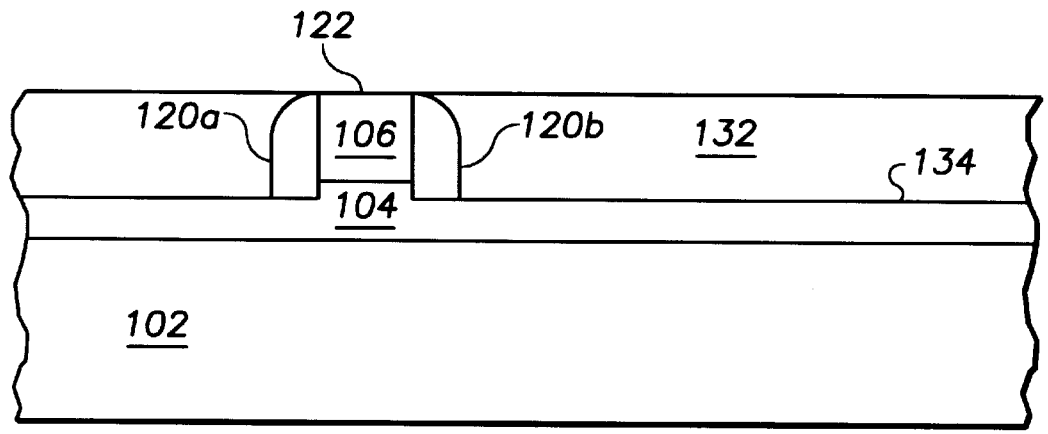
FIG. 4 is a partial cross-sectional view of a semiconductor structure, constructed in accordance with the process sequence of FIGS. 1–3, in which a gate conductive layer is formed on the high-K layer.

FIG. 4 is a partial cross-sectional view of a semiconductor structure, constructed in accordance with the process sequence of FIGS. 1–3, in which a gate conductive layer 132 is formed on the high-K layer 104. The gate conductive layer 132 can be, for example, polysilicon, that is deposited on the surface 134 of the high-K layer 104. The polysilicon deposition can be accomplished as described above. Alternatively, the gate conductive layer 134 may comprise titanium nitride, titanium tungsten, or other conductive material compatible with the process sequence. The gate conductive layer 132 is planarized relative to surface 122 of gate electrode 106 with a chemical-mechanical polish.

Figure 5:
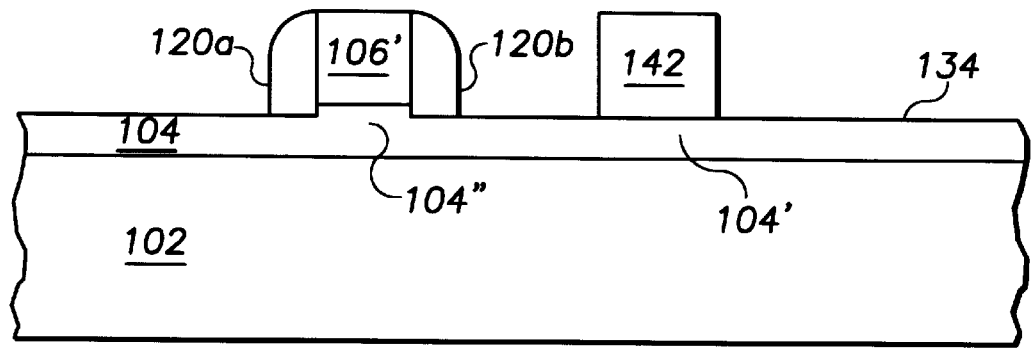
FIG. 5 is a partial cross-sectional view of a semiconductor structure having gate electrodes formed on two thicknesses of a high-K gate dielectric layer.

In one example embodiment, the gate conductive layer 132 is then masked and etched to form another gate electrode 142 as shown in FIG. 5. In an alternative embodiment, before the gate electrode layer 132 is masked and etched, the gate electrode 106 is removed by additional mask and etch operations. Thus, a photoresistive mask for example, expose the gate electrode 106 to etching and the material is removed. In its place, a metal material is deposited and the surface again is polished. To summarize, the gate electrode 106 could initially be formed with polysilicon and thereafter replaced with a metal gate electrode using material such as titanium nitride, titanium tungsten, or cobalt. This provides the feature of having a semiconductor structure having gate electrodes comprised of different materials to achieve selected objectives, such as density and performance.

In FIG. 5 and as explained above, the gate electrodes 106' and 142 may be comprised of the same or different materials, for example, metal and polysilicon, respectively. As applied to an entire integrated circuit, it will be appreciated that the invention is not limited to gate electrodes of metal and polysilicon. Different types of metals could be used in different transistors to achieve required performance and/or manufacturing objectives. It will also be appreciated that the metal gate electrode may be disposed on the thinner portion 104' of the gate insulating layer 104, and the polysilicon gate electrode may be disposed on the thicker portion 104" of the gate insulating layer.

It will be appreciated that an additional feature of the example embodiment of FIG. 5 is that the gate electrodes 106' and 142 are formed on the same high-K gate dielectric layer 104, however, the thickness of the portion 104" is different from the thickness of the portion 104'. Thus, transistors having different performance characteristics can be formed in an efficient fabrication process.

In another example embodiment, additional process sequences of etching the high-K dielectric layer 104 to further reduce its thickness and forming additional gate electrode structures could be integrated to form a semiconductor structure having three or more high-K gate dielectric thicknesses.

Figure 6:
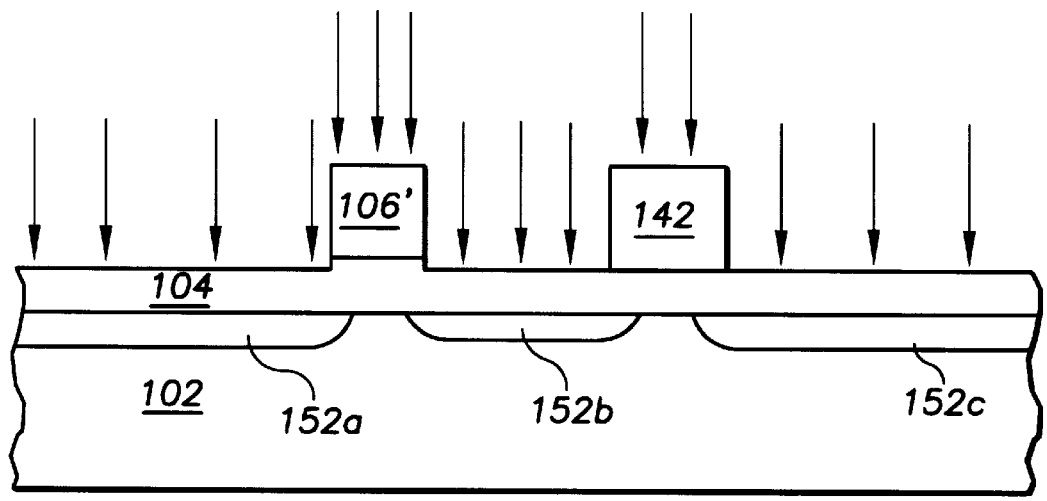
FIG. 6 is a partial cross-sectional view of a semiconductor structure undergoing an LDD implant.

FIG. 6 is a partial cross-sectional view of a semiconductor structure undergoing an LDD implant, the structure having been formed in accordance with the above described embodiments. In one example embodiment, the spacers 120a and 120b are first removed, and in an alternative embodiment, the spacers could be left adjacent the gate electrode 106'. In the embodiment where the spacers 120a–b are not removed, an LDD implant is performed after the process sequence described in FIG. 2, for example. Thus, after the process flow of FIG. 5, a source-drain implant is performed resulting in a semiconductor structure wherein the gate electrode 106' has spacers and the gate electrode 142 does not have spacers.

In the embodiment where the spacers 120a and 120b are stripped, the LDD implant is performed with a first dopant species into the respective source and drain regions, wherein the LDD implant areas are designated as 152a–c. It will be appreciated that although the illustrated structure includes an LDD region 152b that couples the source/drain regions of the transistors eventually formed with gate electrodes 106' and 142, the present invention can be applied to construct transistors having different high-K gate dielectric thicknesses and not having the illustrated source-drain connection. In an example embodiment, the ion concentration of the LDD implant is in the range of approximately 8E14 to 3E15 ions/cm$^2$, and the implant energy can range from approximately 0.5 KeV to 5 KeV. The first dopant species may be ions of boron, phosphorus, or arsenic, for example.

Figure 7:
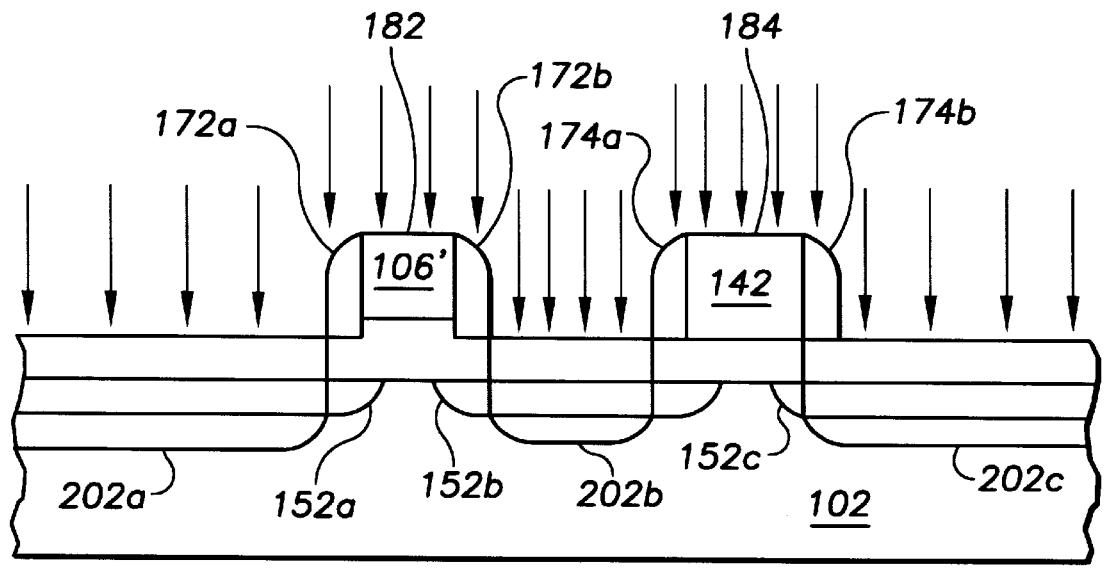
FIG. 7 is a partial cross-sectional view of a semiconductor structure undergoing a source-drain implant.

FIG. 7 is a partial cross-sectional view of a semiconductor structure undergoing a source-drain implant. Prior to the implant however, spacers 172a–b and 174a–b are formed beside the gate electrodes 106' and 142, respectively. In a first stage, spacer material is deposited over the high-K layer 104 (FIG. 3A) and over the gate electrodes 106' and 142. In an example embodiment, the spacer material is comprised of a CVD oxide film. The spacer material is then planarized with the surfaces 182 and 184 of gate electrodes 106' and 142, masked with a photoresistive material to shield the spacers 172a–b and 174a–b, and etched. Removal of the spacer material leaves spacers 172a–b and 174a–b, and thereafter the photoresistive material is removed.

In the alternate embodiment as described for FIG. 6, wherein the spacers 120a–b are not removed, gate electrodes 106' and 142 may have spacers of different widths. For example, gate electrode 106' may have spacers 120a–b and gate electrode 142 may have spacers 174a–b.

Following formation of spacers 172a–b and 174a–b, a second concentration of a second dopant species is introduced to form the source and drain regions 202a and 202b and 202c. The second dopant species may be ions of boron, phosphorus, or arsenic, for example, implanted at an energy level that ranges from approximately 0.2 KeV to 5 KeV and an ion concentration of approximately 2E15–6E15 ions/cm$^2$.

As noted above, the present invention is applicable to fabrication of a number of different devices. Accordingly, the present invention should not be considered limited to the particular examples described above, but rather should be understood to cover all aspects of the invention as fairly set out in the attached claims. Various modifications, equivalent processes, as well as numerous structures to which the present invention may be applicable will be readily apparent to those of skill in the art upon review of the present specification. The claims are intended to cover such modifications and devices.

We claim:

1. A process for forming a semiconductor structure on a silicon substrate, comprising:

depositing a high permittivity layer on the substrate, the high permittivity layer having a first thickness of about 100–500 Å and a dielectric constant of at least 20;

depositing a gate conductive layer on the high permittivity layer;

etching selected portions of the gate conductive layer in a reaction chamber with a first etchant, including HBr and Cl$_2$, wherein a first set of one or more gate electrodes are formed on the high permittivity layer having the first thickness;

purging the first etchant from the reaction chamber;

introducing a second etchant, including $CHF_3$ and Argon, into the reaction chamber for etching the high permittivity layer;

etching selected portions of the high permittivity layer, whereby the high permittivity layer is reduced to a second thickness; and forming a second set of gate electrodes on the selected portions of the high permittivity layer having the second thickness.

2. A process for forming a semiconductor structure on a silicon substrate, comprising:

depositing a high permittivity layer on the substrate, the high permittivity layer having a first thickness of about 100–500 Å and a dielectric constant of at least 20;

depositing a gate conductive layer on the high permittivity layer;

etching selected portions of the gate conductive layer, whereby a first set of one or more gate electrodes are formed on the high permittivity layer having the first thickness;

etching selected portions of the high permittivity layer, whereby the high permittivity layer is reduced to a second thickness;

forming a second set of gate electrodes on the selected portions of the high permittivity layer having the second thickness;

forming a first set of spacers beside the first set of one or more gate electrodes before forming the second set of gate electrodes; and removing the first set of spacers after forming the second set of gate electrodes.

3. A process for forming a semiconductor structure on a silicon substrate, comprising:

depositing a high permittivity layer on the substrate, the high permittivity layer having a first thickness;

forming a first set of one or more gate electrodes on the high permittivity layer having the first thickness;

removing selected portions of the high permittivity layer, wherein the high permittivity layer is reduced to a second thickness;

forming a second set of gate electrodes on the selected portions of the high permittivity layer having the second thickness;

removing selected portions of the high permittivity layer, wherein the high permittivity layer is reduced to a third thickness; and forming a third set of gate electrodes on the selected portions of the high permittivity layer having the third thickness.

4. The structure of claim 3 wherein the high permittivity layer is comprised of material selected from the group of barium strontium titanate, tantalum oxide, lead zinc niobate, and lead scandium tantalum oxide.

5. The process of claim 3, wherein one or more of the first set of gate electrodes are comprised of metal.

6. The process of claim 5, wherein one or more of the second set of gate electrodes are comprised of polysilicon.

7. The process of claim 5, wherein the metal of the one or more of the firs set of gate electrodes is selected from the group of tungsten and cobalt.

8. The process of claim 3, wherein one or more of the first set of gate electrodes are comprised of polysilicon.

9. The process of claim 8, wherein one or more of the second set of gate electrodes are comprised of metal.

10. A process for forming a semiconductor structure on a silicon substrate, comprising:

depositing a high permittivity layer on the substrate, the high permittivity layer having a first thickness of about 100–500 Å and a dielectric constant of at least 20;

depositing a gate conductive layer on the high permittivity layer;

etching selected portions of the gate conductive layer, whereby a first set of one or more gate electrodes are formed on the high permittivity layer having the first thickness;

etching selected portions of the high permittivity layer, whereby the high permittivity layer is reduced to a second thickness;

forming a second set of gate electrodes on the selected portions of the high permittivity layer having the second thickness;

etching selected portions of the high permittivity layer to create a third thickness of the high permittivity layer; and forming a third set of gate electrodes on the selected portions of the high permittivity layer having the third thickness.

11. The process of claim 10, further comprising:

wherein etching the selected portions of the gate conductive layer is performed in a reaction chamber with a first etchant;

purging the first etchant from the reaction chamber; and introducing a second etchant into the reaction chamber for etching the high permittivity layer.

12. The process of claim 11, wherein the gate conductive layer is polysilicon and the first etchant is comprised of HBr and $Cl_2$, and the second etchant is comprised of $CHF_3$ and Argon.

13. The process of claim 12, further comprising implanting a first concentration of a first dopant species into the substrate adjacent the first set of one or more gate electrodes after removing the first set of spacers.

14. The process of claim 13, wherein the first dopant species is selected from the group of boron, phosphorus, or arsenic.

15. The process of claim 14, wherein the first concentration of the first dopant species is in the range of approximately 8e14–3e15 ions/cm$^2$.

16. The process of claim 15, wherein the first dopant species is implanted with an energy level in the range of approximately 0.5 KeV to 5 KeV.

17. The process of claim 13, further comprising forming a second set of spacers beside the first set and second set of gate electrodes on the high permittivity layer.

18. The process of claim 17, further comprising implanting a second concentration of a second dopant species into the substrate adjacent the second set of spacers.

19. The process of claim 18, wherein the second dopant species is selected from the group of boron, phosphorus, or arsenic.

20. The process of claim 19, wherein the second dopant species is implanted with an energy level in the range of approximately 0.2 KeV to 5 KeV.

21. The process of claim 20, wherein the second dopant species is implanted with a dose rate of approximately 2E15–6 E15 ions/cm$^2$.

22. The process of claim 10, further comprising forming spacers beside the first set and second set of gate electrodes on the high permittivity layer.

23. The process of claim 10, further comprising:

implanting a first concentration of a first dopant species into the substrate beside the first set of gate electrodes after forming the first set of gate electrodes;

forming a first set of spacers beside the first set of gate electrodes before forming the second set of gate electrodes; and implanting a second concentration of a second dopant species into the substrate adjacent the first set and second set of gate electrodes.

24. The process of claim 23, further comprising forming a second set of spacers adjacent the second set of gate electrodes before implanting the second dopant species into the substrate.

* * * * *

UNITED STATES PATENT AND TRADEMARK OFFICE
CERTIFICATE OF CORRECTION

PATENT NO. : 6,168,958 B1
DATED : January 2, 2001
INVENTOR(S) : Gardner et al.

It is certified that error appears in the above-identified patent and that said Letters Patent is hereby corrected as shown below:

Column 4,
Line 5, "Aug. 9" should read -- Aug. 29 --.

Signed and Sealed this

Eleventh Day of February, 2003

JAMES E. ROGAN
*Director of the United States Patent and Trademark Office*